(12) United States Patent
Strang

(10) Patent No.: US 7,563,328 B2
(45) Date of Patent: Jul. 21, 2009

(54) METHOD AND APPARATUS FOR GAS INJECTION SYSTEM WITH MINIMUM PARTICULATE CONTAMINATION

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 1110 days.

(21) Appl. No.: 10/466,107

(22) PCT Filed: Jan. 22, 2002

(86) PCT No.: PCT/US02/01641

§ 371 (c)(1),
(2), (4) Date: Dec. 23, 2003

(87) PCT Pub. No.: WO02/061179

PCT Pub. Date: Aug. 8, 2002

(65) Prior Publication Data

US 2004/0079484 A1    Apr. 29, 2004

Related U.S. Application Data

(60) Provisional application No. 60/262,376, filed on Jan. 19, 2001.

(51) Int. Cl.
*C23C 16/455* (2006.01)
*C23F 1/00* (2006.01)
*H01L 21/306* (2006.01)
*C23C 16/08* (2006.01)
*C23C 16/44* (2006.01)

(52) U.S. Cl. ............... 118/663; 118/715; 156/345.24; 156/345.26

(58) Field of Classification Search ........... 118/663, 118/715; 156/345.24, 345.26
See application file for complete search history.

(56) References Cited

U.S. PATENT DOCUMENTS 4,500,408 A * 2/1985 Boys et al. ............ 204/298.03
4,640,221 A * 2/1987 Barbee et al. ............ 118/689

(Continued)

FOREIGN PATENT DOCUMENTS

JP    56102577 A *    8/1981

(Continued)

*Primary Examiner*—Rudy Zervigon
(74) *Attorney, Agent, or Firm*—Oblon, Spivak, McClelland, Maier & Neustadt, P.C.

(57) ABSTRACT

A gas injection system (10) is provided for a processing reactor and a method is provided for reducing transport of particulate material onto a substrate (12) during process gas start-up. The system (10) includes a two-way valve (40) having an inlet (42) connected to a mass flow controller (30), and first and second outlets (44, 46). The system (10) includes a principle gas feed line (50) connecting the first outlet (44) of the valve (40) to an inject plate (24) within a vacuum chamber (20) at a position above a substrate (12), and a start-up line (60) connecting the second outlet (46) to an orifice (62) in the chamber (20) at a position not above the substrate (12). Alternatively, the system includes a valve having an inlet connected to the mass flow controller, and a first outlet. In the alternative system, a first gas feed line connects the first outlet of the valve to the inject plate (24), and an acoustical dampening device is provided within the first gas feed line.

25 Claims, 5 Drawing Sheets

U.S. PATENT DOCUMENTS

| | | | | |
|---|---|---|---|---|
| 4,747,367 | A | * | 5/1988 | Posa .......................... 118/715 |
| 4,761,269 | A | * | 8/1988 | Conger et al. ............... 118/679 |
| 4,958,658 | A | * | 9/1990 | Zajac ......................... 137/613 |
| 5,097,890 | A | * | 3/1992 | Nakao ........................ 165/206 |
| 5,137,701 | A | * | 8/1992 | Mundt ........................ 423/210 |
| 5,158,534 | A | * | 10/1992 | Berry et al. ................ 604/6.14 |
| 5,182,704 | A | | 1/1993 | Bengtsson ................... 700/52 |
| 5,281,274 | A | * | 1/1994 | Yoder ......................... 118/697 |
| 5,307,568 | A | * | 5/1994 | Matsuo et al. ................ 34/92 |
| 5,314,541 | A | * | 5/1994 | Saito et al. .................. 118/725 |
| 5,336,356 | A | * | 8/1994 | Ban et al. ............... 156/345.26 |
| 5,385,624 | A | * | 1/1995 | Amemiya et al. ...... 156/345.24 |
| 5,423,936 | A | * | 6/1995 | Tomita et al. ........... 156/345.34 |
| 5,453,124 | A | * | 9/1995 | Moslehi et al. .............. 118/715 |
| 5,460,654 | A | * | 10/1995 | Kikkawa et al. ............. 118/726 |
| 5,494,522 | A | * | 2/1996 | Moriya et al. ............... 118/719 |
| 5,496,408 | A | * | 3/1996 | Motoda et al. .............. 118/715 |
| 5,500,256 | A | * | 3/1996 | Watabe ....................... 427/579 |
| 5,529,657 | A | * | 6/1996 | Ishii ....................... 156/345.26 |
| 5,531,834 | A | * | 7/1996 | Ishizuka et al. ........... 118/723 I |
| 5,547,539 | A | * | 8/1996 | Arasawa et al. ............. 438/715 |
| 5,571,366 | A | * | 11/1996 | Ishii et al. ............... 156/345.26 |
| 5,698,070 | A | * | 12/1997 | Hirano et al. ............... 438/729 |
| 5,702,562 | A | * | 12/1997 | Wakahara .................... 216/60 |
| 5,714,194 | A | * | 2/1998 | Komai et al. ................. 427/81 |
| 5,769,950 | A | * | 6/1998 | Takasu et al. ............... 118/715 |
| 5,792,261 | A | * | 8/1998 | Hama et al. .............. 118/723 I |
| 5,816,285 | A | * | 10/1998 | Ohmi et al. ............... 137/487.5 |
| 5,837,093 | A | * | 11/1998 | Hasegawa et al. ...... 156/345.33 |
| 5,851,842 | A | * | 12/1998 | Katsumata et al. ............. 438/9 |
| 5,878,191 | A | * | 3/1999 | Miyashita et al. ........... 392/416 |
| 5,888,413 | A | * | 3/1999 | Okumura et al. .............. 216/68 |
| 5,888,907 | A | * | 3/1999 | Tomoyasu et al. .......... 438/714 |
| 5,902,403 | A | * | 5/1999 | Aitani et al. ................. 118/715 |
| 5,919,332 | A | | 7/1999 | Koshiishi et al. ........ 156/345.47 |
| 5,951,772 | A | * | 9/1999 | Matsuse et al. ......... 118/723 R |
| 5,958,140 | A | * | 9/1999 | Arami et al. ................ 118/725 |
| 5,980,686 | A | * | 11/1999 | Goto ....................... 156/345.26 |
| 5,980,687 | A | * | 11/1999 | Koshimizu ............. 156/345.29 |
| 6,093,662 | A | * | 7/2000 | Ohmi et al. ................. 438/773 |
| 6,132,552 | A | | 10/2000 | Donohoe et al. ....... 156/345.33 |
| 6,149,729 | A | * | 11/2000 | Iwata et al. ................. 118/715 |
| 6,162,323 | A | * | 12/2000 | Koshimizu ............. 156/345.26 |
| 6,170,428 | B1 | * | 1/2001 | Redeker et al. ........... 118/723 I |
| 6,176,667 | B1 | * | 1/2001 | Fairbairn et al. ............. 414/217 |
| 6,178,995 | B1 | * | 1/2001 | Ohmi et al. .................. 137/486 |
| 6,187,091 | B1 | * | 2/2001 | Hamilton ..................... 117/89 |
| 6,194,038 | B1 | * | 2/2001 | Rossman ..................... 427/569 |
| 6,200,387 | B1 | * | 3/2001 | Ni ............................... 118/722 |
| 6,200,911 | B1 | * | 3/2001 | Narwankar et al. ......... 438/758 |
| 6,207,007 | B1 | * | 3/2001 | Segawa et al. ......... 156/345.26 |
| 6,210,482 | B1 | * | 4/2001 | Kitayama et al. ............ 118/715 |
| 6,273,954 | B2 | * | 8/2001 | Nishikawa et al. .......... 118/692 |
| 6,287,980 | B1 | * | 9/2001 | Hanazaki et al. ............ 438/726 |
| 6,299,722 | B1 | * | 10/2001 | Toda ....................... 156/345.25 |
| 6,315,858 | B1 | * | 11/2001 | Shinozuka et al. ..... 156/345.33 |
| 6,333,272 | B1 | * | 12/2001 | McMillin et al. ............ 438/710 |
| 6,360,762 | B2 | * | 3/2002 | Kitayama et al. ............... 137/1 |
| 6,422,264 | B2 | * | 7/2002 | Ohmi et al. ............... 137/487.5 |
| 6,432,259 | B1 | * | 8/2002 | Noorbakhsh et al. ... 156/345.33 |
| 6,447,651 | B1 | * | 9/2002 | Ishikawa et al. ......... 204/192.1 |
| 6,453,992 | B1 | * | 9/2002 | Kim .......................... 165/206 |
| 6,482,266 | B1 | * | 11/2002 | Matsumoto et al. ......... 118/715 |
| 6,508,913 | B2 | * | 1/2003 | McMillin et al. ....... 156/345.29 |
| 6,581,623 | B1 | * | 6/2003 | Carpenter et al. ............ 137/113 |
| 6,645,302 | B2 | * | 11/2003 | Udagawa .................... 118/715 |
| 6,676,760 | B2 | * | 1/2004 | Kholodenko et al. ........ 118/728 |
| 6,716,302 | B2 | * | 4/2004 | Carducci et al. ........ 156/345.47 |
| 6,752,547 | B2 | * | 6/2004 | Britcher et al. .............. 396/626 |
| 6,776,874 | B2 | * | 8/2004 | Kobayashi et al. ..... 156/345.51 |
| 6,797,639 | B2 | * | 9/2004 | Carducci et al. ............. 438/710 |
| 6,800,139 | B1 | * | 10/2004 | Shinriki et al. .............. 118/715 |
| 6,808,758 | B1 | * | 10/2004 | Thakur ........................ 427/559 |
| 6,812,157 | B1 | * | 11/2004 | Gadgil ........................ 438/763 |
| 6,829,056 | B1 | * | 12/2004 | Barnes et al. ................ 356/625 |
| 6,869,499 | B2 | * | 3/2005 | Toshima et al. ........ 156/345.29 |
| 6,913,652 | B2 | * | 7/2005 | Shan .......................... 118/719 |
| 6,941,965 | B2 | * | 9/2005 | Lull et al. ....................... 137/9 |
| 6,955,198 | B2 | * | 10/2005 | Wodjenski ................... 141/248 |
| 2001/0006705 | A1 | * | 7/2001 | Takeshima ............. 427/255.28 |
| 2003/0070619 | A1 | * | 4/2003 | Rossman .................... 118/715 |
| 2004/0112540 | A1 | * | 6/2004 | Larson et al. ........... 156/345.33 |
| 2004/0123805 | A1 | * | 7/2004 | Tomoyoshi ................. 118/728 |
| 2005/0160983 | A1 | * | 7/2005 | Sneh ........................... 118/715 |

FOREIGN PATENT DOCUMENTS

| | | | |
|---|---|---|---|
| JP | 05068866 | A * | 3/1993 |
| JP | 05068867 | A * | 3/1993 |
| JP | 110355589 | A * | 2/1999 |
| JP | 2002110567 | A * | 4/2002 |

* cited by examiner

METHOD AND APPARATUS FOR GAS INJECTION SYSTEM WITH MINIMUM PARTICULATE CONTAMINATION

CROSS-REFERENCE TO RELATED APPLICATIONS

This application is a national stage application of PCT International Application No. PCT/US02/01641, filed Jan. 22, 2002, which claims priority to U.S. Provisional Application 60/262,376, filed Jan. 19, 2001. The entire contents of these parent applications are incorporated herein by reference.

BACKGROUND OF THE INVENTION

1. Field of the Invention

The present invention relates generally to gas injection systems for processing reactors.

2. Discussion of the Background

The inventors have identified a problem with conventional processing reactors that is solved by the present invention. The inventors have determined that in conventional processing reactors using conventional gas injections systems particulate contamination can occur on a substrate being processed due to particulate deposition upon the substrate during process initialization. For example, when gas flow is initialized to start a process, a mass flow controller is generally opened to allow a precise flow rate of gas(es) into the vacuum chamber, hence exposing a high pressure region (e.g., 10's of psi) upstream of the controller to a low pressure region (e.g., 100's of mTorr) downstream of the controller and within the vacuum chamber. When this occurs compression waves will travel through plumbing of the gas injection system to the vacuum chamber, while expansion waves will propagate backward towards the high pressure region. The compression waves will travel at approximately an average speed of sound between the two gas pressure regions. The compression waves will exhibit strong gradients in flow properties. The locally intense flow structures caused by the compression waves could cause removal of particulate material from surfaces of the gas injection system, and transporting of the particulate material onto the substrate through an inject plate in the chamber. In other words, the substrate could be exposed to the gas injection system "sneezing" upon it.

The inventors have determined that the initial transients associated with the sudden flow of gas from a region of high pressure to a region of low pressure can cause the generation of gas entrained particles due to the sharp flow gradients developed under a sudden expansion. Also, due to the presence of the substrate below the inject electrode, the unwanted particles may be deposited upon the substrate causing reduced process yield. The problem is further exacerbated in systems requiring high pressure gas injection. In an effort to eliminate or minimize these potential sources of contamination, the inventors have constructed an apparatus and method as described in detail below.

SUMMARY OF THE INVENTION

Accordingly, the present invention advantageously provides an apparatus and method to minimize particulate deposition upon the substrate during the process initialization.

A first embodiment of the present invention advantageously provides a gas injection system for a processing reactor including a mass flow controller and a vacuum chamber with an inject plate configured to be located above a substrate. The gas injection system of the first embodiment of the present invention includes a two-way valve having an inlet adapted to be connected to the mass flow controller, a first outlet, and a second outlet. The gas injection system of the first embodiment further includes a principle gas feed line connected to the first outlet of the two-way valve, where the principle gas feed line is adapted to be connected to the inject plate, and a start-up line connected to the second outlet of the two-way valve, where the start-up line has an orifice adapted to be connected to the vacuum chamber at a position not above the substrate.

The first embodiment of the present invention preferably advantageously includes a pressure measurement device provided within the principle gas feed line and a pressure measurement device provided within the start-up line. The invention further preferably includes an acoustical dampening device provided within the principle gas feed line, and an acoustical dampening device provided within the start-up line. The orifice of the start-up line is preferably adapted to be located proximate to or within an exhaust port of the vacuum chamber. The inject plate is preferably a reactor upper electrode, and the inject plate preferably has a plurality of injection orifices.

A first method of the present invention advantageously provides for reducing transport of particulate material onto a substrate during process gas start-up. The method includes the step of providing a two-way valve having an inlet connected to a mass flow controller, a first outlet connected by a principle gas feed line to an inject plate of a vacuum chamber, and a second outlet connected by a start-up line to an orifice in the vacuum chamber at a position not above the substrate, where the inject plate is located above the substrate. The method further includes the step of opening the second outlet during propagation of initialization transients, while the first outlet remains closed.

The first method of the present invention preferably advantageously provides the step of opening the first outlet after the propagation of initialization transients subsides. The method also preferably provides the step of measuring a pressure within the start-up line.

A second embodiment of the present invention advantageously provides a gas injection system for a processing reactor including a mass flow controller and a vacuum chamber with an inject plate configured to be located above a substrate. The gas injection system includes a valve having an inlet adapted to be connected to the mass flow controller, and a first outlet. A first gas feed line is connected to the first outlet of the valve, and the first gas feed line is adapted to be connected to the inject plate. The gas injection system further advantageously provides an acoustical dampening device provided within the first gas feed line.

The second embodiment of the present invention preferably advantageously provides that the valve is a two-way valve having a second outlet, and further provides a second gas feed line connected to the second outlet of the two-way valve, where the second gas feed line has an orifice adapted to be connected to the inject plate. The invention further preferably includes a pressure measurement device provided within the second gas feed line. The invention preferably provides that the acoustical dampening device is a muffler having a series of porous plates therein, where the series of porous plates contain holes that are not generally aligned in adjacent plates. Alternatively, the invention preferably provides that the acoustical dampening device is a muffler having a honeycomb structure therein. The invention preferably provides a first pressure measurement device within the first gas feed line upstream of the acoustical dampening device and a second pressure measurement device within the first gas feed line downstream of the acoustical dampening device. The invention preferably provides that the inject plate is a reactor upper electrode, and that the inject plate has a plurality of injection orifices.

A second method of the present invention advantageously provides for reducing transport of particulate material onto a substrate during process gas start-up. The method includes the step of providing a valve having an inlet connected to a mass flow controller, and a first outlet connected by a first gas feed line to an inject plate of a vacuum chamber, where the inject plate is located above the substrate. The method further includes the steps of providing an acoustical dampening device within the first gas feed line, and opening the first outlet during propagation of initialization transients.

The first method of the present invention preferably advantageously provides that the valve is a two-way valve having a second outlet, and further includes the steps of providing a second gas feed line connected to the second outlet of the two-way valve, where the second gas feed line has an orifice adapted to be connected to the inject plate, and opening the second outlet after the propagation of initialization transients subsides. The method also preferably provides the step of measuring a pressure within the first gas feed line.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

The present invention will now be described with reference to preferred embodiments that provide advantageous structures that overcome the problems identified by the inventors which are described above.

Figure 1:
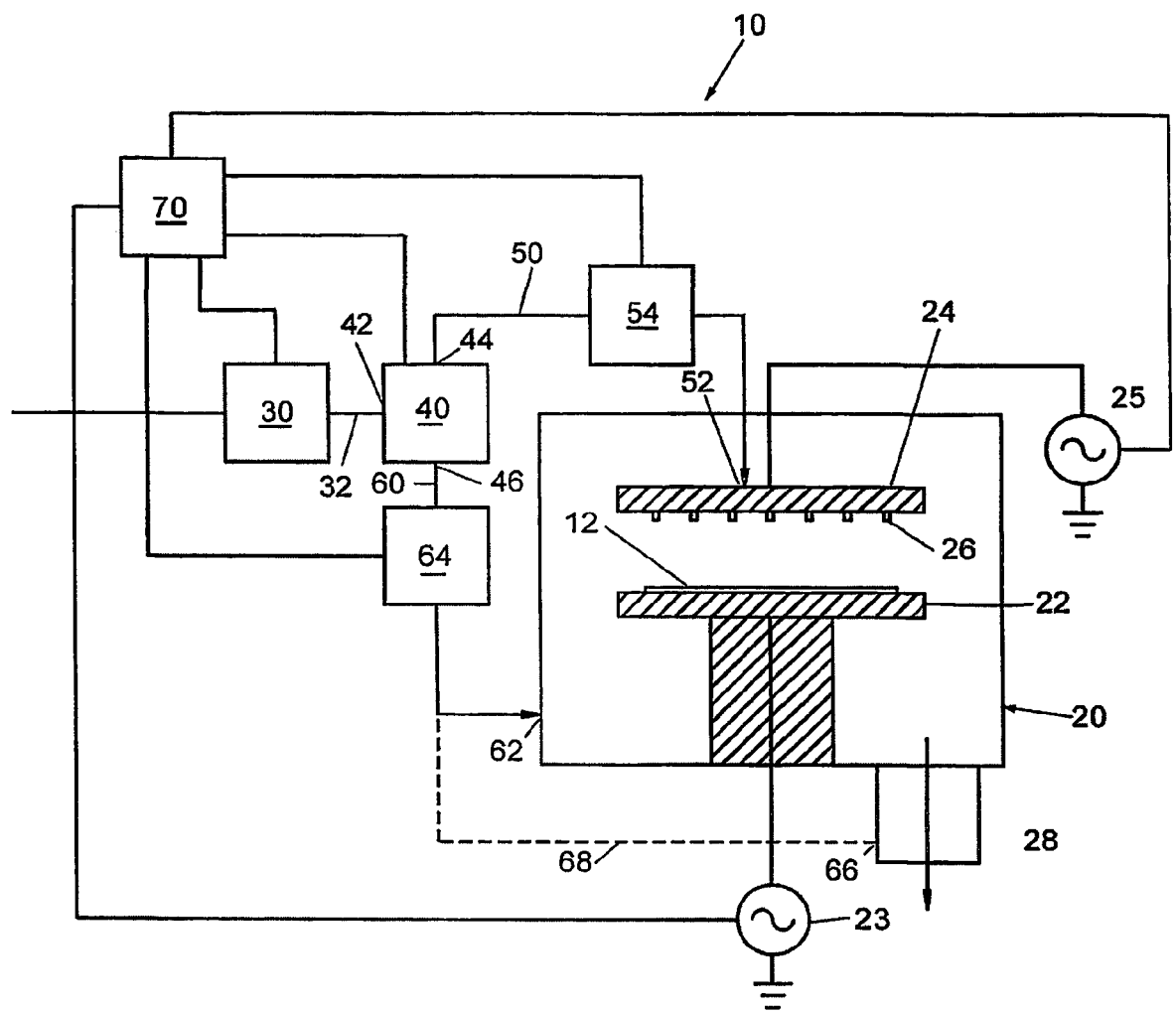
FIG. 1 is a schematic representation of a gas injection system for a processing reactor according to a first embodiment of the present invention.
Figure 2:
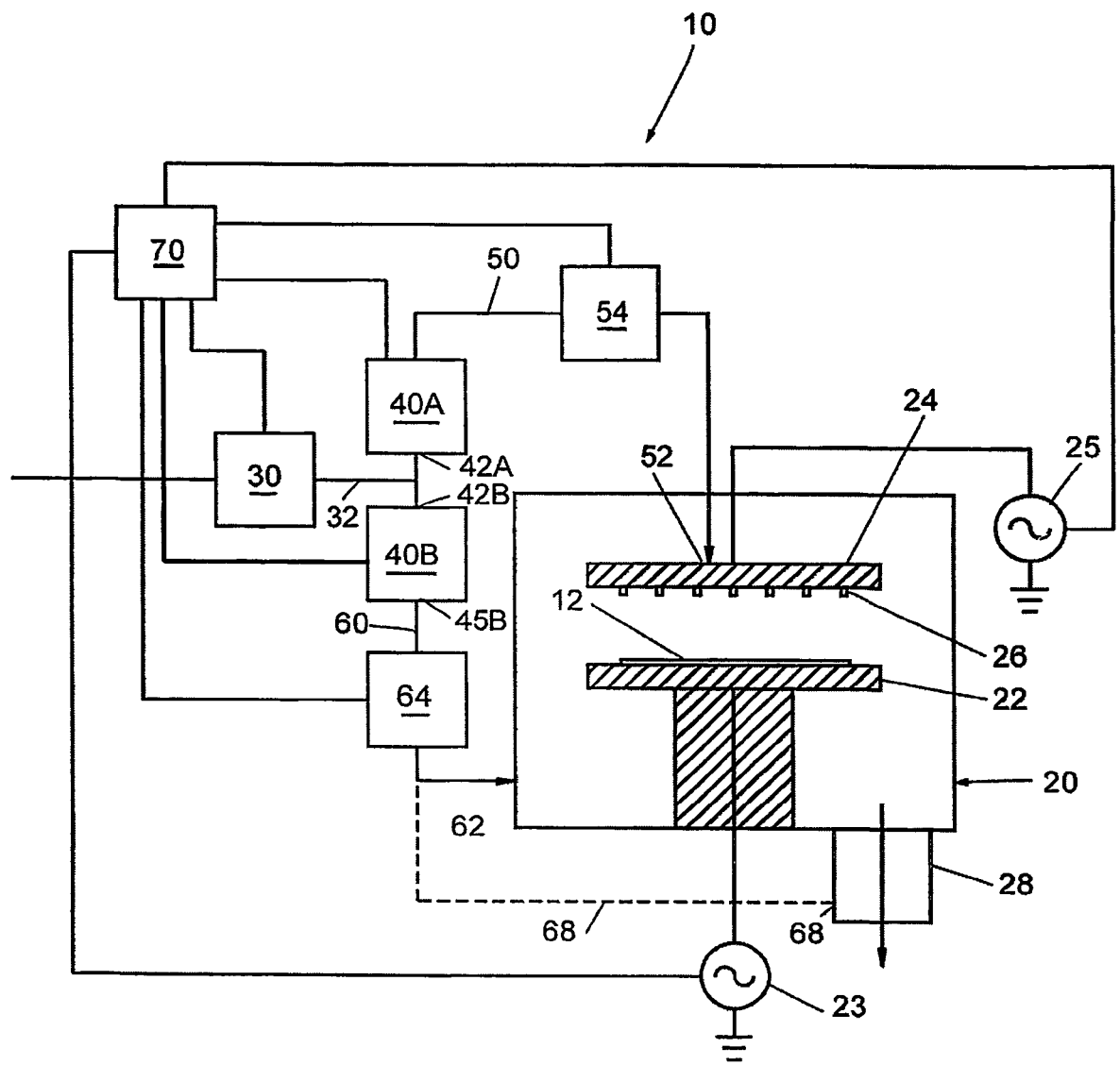
FIG. 2 is a schematic representation of a gas injection system for a processing reactor according to a second embodiment of the present invention.
Figure 3:
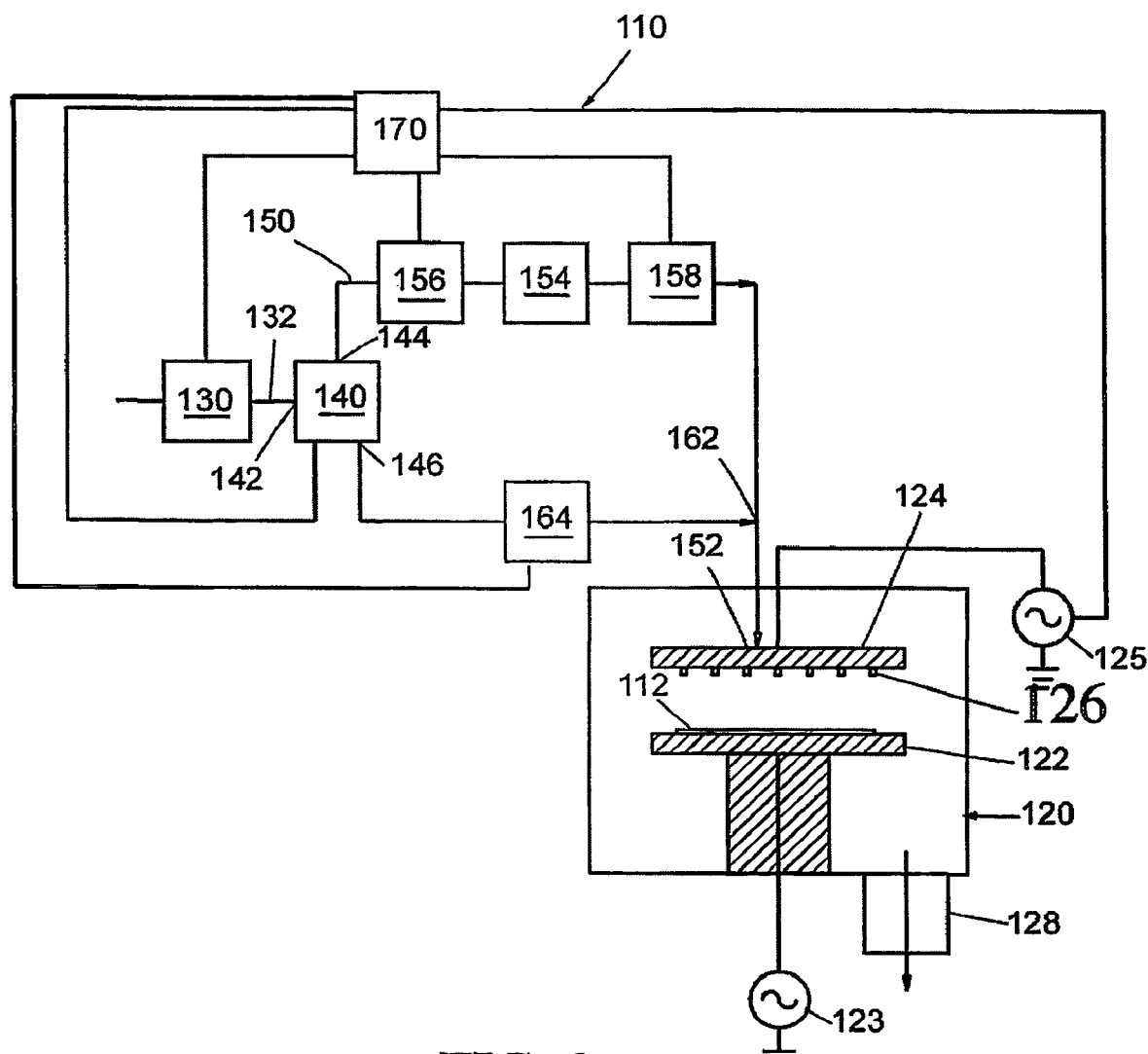
FIG. 3 is a schematic representation of a gas injection system for a processing reactor according to a third embodiment of the present invention.
Figure 4:
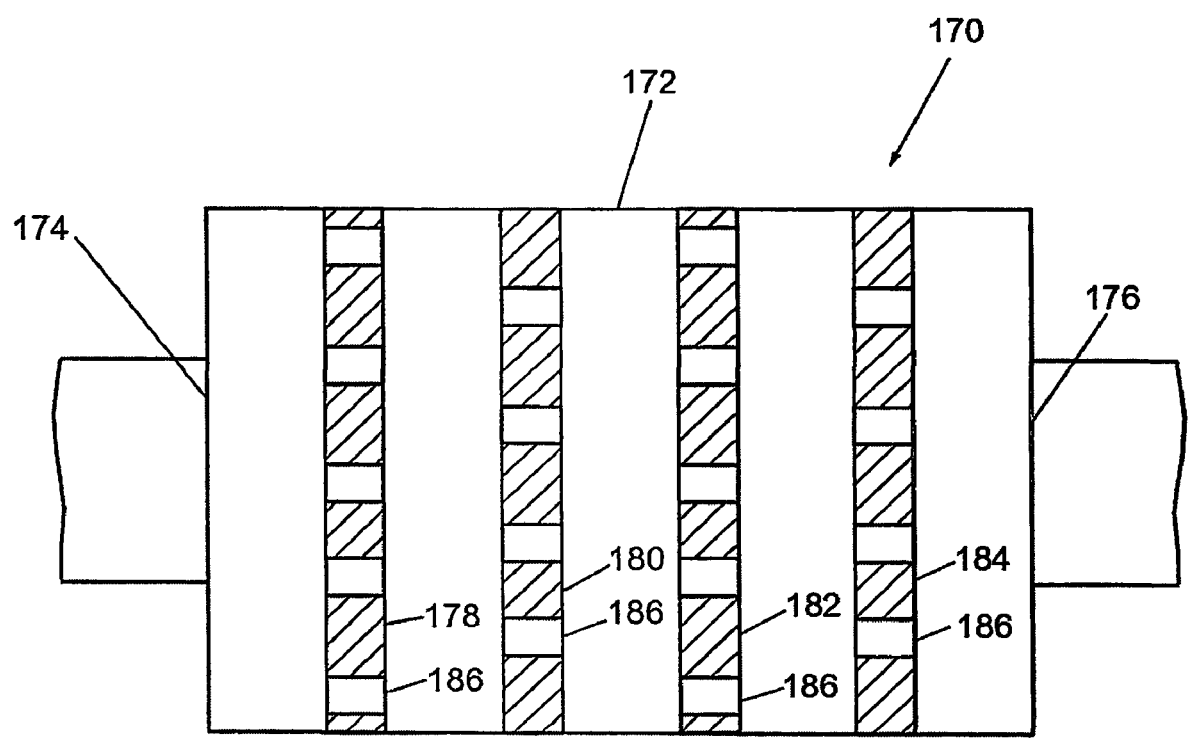
FIG. 4 is an enlarged, cross-sectional view of a first embodiment of an acoustical dampening device according to the present invention.
Figure 5:
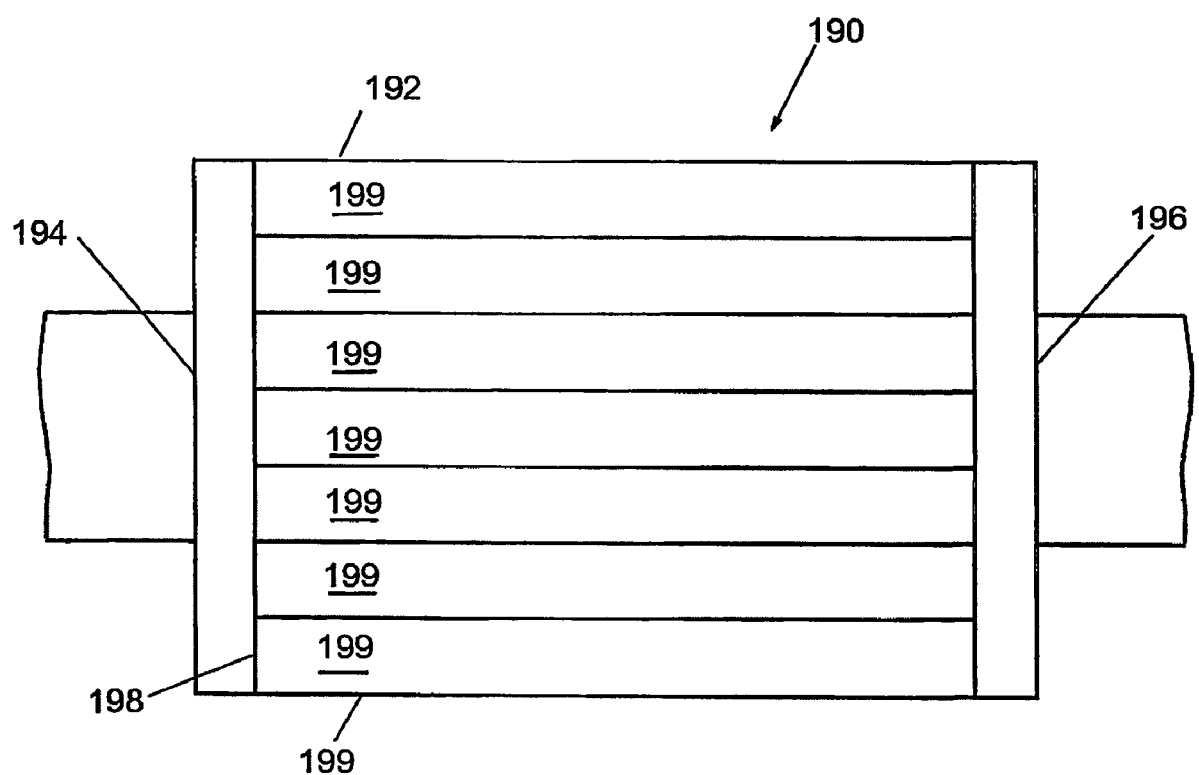
FIG. 5 is an enlarged, cross-sectional view of a second embodiment of an acoustical dampening device according to the present invention.

Referring now to the drawings, FIGS. 1, 2 and 3 depict first, second and third embodiments, respectively, of a gas injection system for a processing reactor according to the present invention. While FIGS. 4 and 5 depict first and second embodiments, respectively, of acoustical dampening devices for use in the various embodiments of the gas injection systems.

FIG. 1 depicts a first embodiment of a gas injection system 10 for a processing reactor. The present invention is well suited for use in parallel plate capacitively coupled plasma (CCP) processing reactors. However, the present invention is further applicable to other types of processing reactors including, for example, inductively coupled plasma (ICP) processing reactors, electron cyclotron resonance (ECR) processing reactors, helicon wave processing reactors, surface wave plasma (SWP) processing reactors, etc. The processing reactor generally includes a vacuum chamber 20, a lower electrode 22 having a power source 23 and an upper electrode 24 having a power source 25. The flow of process gas is controlled via a mass flow controller 30, which supplies process gas to an inject plate. In the preferred embodiment, the inject plate is incorporated into the configuration of the reactor upper electrode 24, which includes a plurality of injection orifices 26 that inject the process gas into the vacuum chamber 20. The process gas enters the reactor upper electrode or inject plate 24 and is distributed to the plurality of injection orifices 26 via a plenum containing a series of baffle plates (not depicted). The reactor upper electrode or inject plate 24 and the plurality of injection orifices 26 are located above the substrate 12 being processed which is supported by the lower electrode 22.

The gas injection system 10 for the processing reactor generally includes a valve system 40 having an inlet 42 connected to the mass flow controller 30 via conduit 32. The valve system 40 also includes a first outlet 44 and a second outlet 46, and can be, for example, a two-way valve. The gas injection system 10 includes a principle gas feed line 50 connected to the first outlet 44 of the two-way valve 40. The principle gas feed line 50 is connected to the inject plate 24 at orifice 52, which supplies the inject plate 24 with process gas from the mass flow controller 30. The principle gas feed line 50 is used during processing of the substrate 12. The gas injection system 10 further includes a start-up line 60 connected to the second outlet 46 of the two-way valve 40. The start-up line 60 has an orifice 62 connected to the vacuum chamber 20 at a position not above the substrate 12. While the selected position within the vacuum chamber 20 of the orifice for the start-up line 60 can be varied as long as the orifice is at a position not above the substrate 12 in order to minimize particulate contamination during start-up, the orifice is preferably positioned proximate to or within an exhaust port 28 of the vacuum chamber 20. An alternate conduit section 68 is depicted in dashed lines in FIG. 1, which is connected to an alternate orifice 66 of the start-up line 60 that is positioned within the exhaust port 28 of the vacuum chamber 20.

The first embodiment of the present invention is an apparatus that redirects process gas flow during the start-up of the processing reactor when propagation of initialization transients occurs. The apparatus redirects the flow of process gas via a two-way valve 40 through the start-up line 60, which injects the process gas at a position not above the substrate. Prior to initiating the flow of gas to the vacuum chamber 20, the two-way valve 40 is activated to direct the gas flow through the start-up line 60 and restrict the gas from flowing through the principle gas feed line 50 to the gas inject plate 24. Thus initial start-up transients are blown into the vacuum chamber 20 below the substrate 12.

The system 10 preferably includes a pressure measurement device 64 or series of pressure measurement devices (for example, a microphone or other sensitive pressure measurement device such as a capacitance manometer or semiconductor strain gauge) provided within the start-up line 60 in order to sense when the propagation of the initial transients has subsided, for example when the pressure has achieved a steady state value. Additionally, a pressure measurement device 54 can be provided within the principle gas feed line 50 if so desired. One example of a pressure sensor is a 1000 Torr full-scale MKS Type 617A sensor which has a response time of less than 1 msec. Furthermore, an acoustical dampening device (for example, a muffler as depicted in FIGS. 4 and 5 or other effective acoustical dampening device) can be provided within the principle gas feed line 50 and/or the start-up line 60 in order to dampen the compression waves propagated during start-up.

The system 10 further includes a controller 70 which is coupled to mass flow controller 30, valve 40, pressure measurement device 54, and pressure measurement device 64. Moreover, controller 70 can be coupled to power sources 23 and 25, and other processing system functions as is customary in the art. Controller 70 controls and coordinates the operation of the above-mentioned systems through respective electronic signals.

In FIG. 2, a second embodiment of the present invention is described for an apparatus the redirects process gas flow during the start-up of the processing reactor when propagation of initialization transients occurs. The second embodiment comprises many of the same elements and corresponding description as the first embodiment in FIG. 1 except that valve system 40 comprises two valves 40A and 40B. Valve 40A comprises an inlet 42A coupled to mass flow controller 30 through line 32 and an outlet 45A. Similarly, valve 40B comprises an inlet 42B coupled to mass flow controller 30 through line 32 and an outlet 45B.

The present invention provides a first method for reducing transport of particulate material onto the substrate during process gas start-up. The method is well suited for use with the gas injection system 10 described above, although other systems can be utilized to perform the method if so desired. The method will be described for purposes of illustration with reference to the gas injection system 10 depicted in FIG. 1.

The method includes the step of providing a two-way valve 40 having an inlet 42 connected to a mass flow controller 30, a first outlet 44 connected by a principle gas feed line 50 to an inject plate 24 of a vacuum chamber 20, and a second outlet 46 connected by a start-up line 60 to an orifice 62 in the vacuum chamber 20 at a position not above the substrate 12, the inject plate 24 being located above the substrate 12. The method further includes the step of opening the second outlet 46 during propagation of initialization transients, while the first outlet 44 remains closed. The method advantageously redirects process gas flow, during the start-up of the processing reactor when propagation of initialization transients occurs, via a two-way valve 40 through the start-up line 60, and injects the process gas at a position not above the substrate 12. By redirecting the process gas flow to a less critical region within the chamber 20, as compared to the region above the substrate 12, the method minimizes particulate contamination of the substrate 12 by reducing transport of particulate material onto the substrate 12 during process gas start-up.

The method preferably includes the step of opening the first outlet 44 after the propagation of initialization transients subsides. At this point the second outlet 46 of the one-way valve 40 can be closed. This allows the flow of the process gas to proceed in a conventional manner through the principle gas feed line 50 to the inject plate 24. The method preferably includes a step of measuring a pressure within the start-up line 60 in order to determine when the propagation of initialization transients has subsided.

FIG. 3 depicts a third embodiment of a gas injection system 110 for a processing reactor. The present invention is well suited for use in parallel plate capacitively coupled plasma (CCP) processing reactors. The processing reactor generally includes a vacuum chamber 120, a lower electrode 122 having a power source 123 and an upper electrode 124 having a power source 125. The flow of process gas is controlled via a mass flow controller 130, which supplies process gas to an inject plate. In the preferred embodiment the inject plate is incorporated into the configuration of the reactor upper electrode 124, which includes a plurality of injection orifices 126 that inject the process gas into the vacuum chamber 120. The process gas enters the reactor upper electrode or inject plate 124 and is distributed to the plurality of injection orifices 126 via a plenum containing a series of baffle plates (not depicted). The reactor upper electrode or inject plate 124 and the plurality of injection orifices 126 are located above the substrate 112 being processed which is supported by the lower electrode 122.

The gas injection system 110 for the processing reactor generally includes a valve 140 (or two valves as in FIG. 2), for example a two-way valve, having an inlet 142 connected to the mass flow controller 130 via conduit 132. The valve 140 also preferably includes a first outlet 144 and a second outlet 146. The gas injection system 110 includes a first gas feed line 150 connected to the first outlet 144 of the valve 140. The first gas feed line 150 is connected to the inject plate 124 at orifice 152. The first gas feed line 150 is further provided with an acoustical dampening device 154 therein, for example a muffler or other effective acoustical dampening device, in order to dampen the compression waves propagated during start-up. The first gas feed line 150 is used during start-up of the processing reactor. The gas injection system 110 further includes a second gas feed line 160 connected to the second outlet 146 of the valve 140. The second gas feed line 160 has an orifice 162 connected to the inject plate 124, for example via a portion of the first gas feed line 150. The second gas feed line 160 is used during normal processing of the substrate 112 via the inject plate 124.

Alternatively, the third embodiment can be constructed without the second gas feed line 160 and corresponding connection points, namely outlet 146 and orifice 162. Moreover, valve 140 can be removed as well. In this configuration, the first gas feed line 150 will be utilized both during start-up and during normal processing of the substrate 112. When the gas injection system 110 is configured for high pressure injection (i.e., configured to minimize total pressure losses in the plumbing of the system), then it is preferred to include the second gas feed line 160 and corresponding connection points for use during normal processing of the substrate 112.

The third embodiment of the present invention is an apparatus that acoustically dampens the propagation of initialization transients during the start-up of the processing reactor. The apparatus preferably redirects the flow of process gas via a valve 140 through an acoustical dampening device 154 in the first gas feed line 150 during the start-up phase. Prior to initiating the flow of gas to the vacuum chamber 120, the two-way valve 140 is activated to direct the gas flow through the first gas feed line 150 and restrict the gas from flowing through the second gas feed line 160. Thus initial start-up transients are blown into the vacuum chamber 120 below the substrate 112.

The system 110 preferably includes a pressure measurement device 156 or series of pressure measurement devices (for example, a microphone or other sensitive pressure measurement device such as a capacitance manometer or semiconductor strain gauge) upstream of the acoustical dampening device 154 within the first gas feed line 150 and a pressure measurement device 158 downstream of the acoustical dampening device 154 in order to sense when the propagation of the initial transients has subsided, for example when the pressure has achieved a steady state value. Once the upstream disturbances have sufficiently attenuated, the valve 140 may be activated to return flow to the second gas feed line 160.

Additionally, a pressure measurement device 164 can be provided within the second gas feed line 160 if so desired. Furthermore, an acoustical dampening device (for example, a muffler as depicted in FIGS. 4 and 5 or other effective acoustical dampening device) can be provided within the second gas feed line 160 if so desired.

The present invention provides a second method for reducing transport of particulate material onto the substrate during process gas start-up. The method is well suited for use with the gas injection system 110 described above, although other systems can be utilized to perform the method if so desired. The method will be described for purposes of illustration with reference to the gas injection system 110 depicted in FIG. 3.

The method includes the step of providing a valve 140 having an inlet 142 connected to a mass flow controller 130, and a first outlet 144 connected by a first gas feed line 150 to an inject plate 124 of a vacuum chamber 120, where the inject plate 124 is located above the substrate 112. The method further includes the step of providing an acoustical dampening device 154 within the first gas feed line 150, and opening the first outlet 144 during propagation of initialization transients. The method advantageously dampens the propagation of initialization transients during the start-up of the processing reactor. By dampening the propagation of initialization transients during start-up, the method minimizes particulate contamination of the substrate 112 by reducing transport of particulate material onto the substrate 112 during process gas start-up.

The method preferably includes the use of a two-way valve 140 having a second outlet 146, and further includes the steps of providing a second gas feed line 160 connected to the second outlet 146 of the two-way valve 140, where the second gas feed line 160 has an orifice 162 connected to the inject plate 124, and opening the second outlet 146 after the propagation of initialization transients subsides. This allows the flow of the process gas to proceed in a conventional manner through the second gas feed line 160 to the inject plate 124. The method preferably includes a step of measuring a pressure within the first gas feed line 150 in order to determine when the propagation of initialization transients has subsided.

FIG. 4 depicts a first embodiment of an acoustical dampening device 170 for use in the various embodiments of the gas injection systems 10 and 110 of the present invention. The device 170 includes a hollow housing 172 with an inlet 174 on one end and an outlet 176 on an opposite end. The device 170 is provided with a series of porous plates 178, 180, 182, 184 that are mounted within the housing 172. The number and configuration of porous plates provided within the housing 172 can be varied depending on the flow and acoustical dampening characteristics desired, as will be readily apparent to one of ordinary skill in the art. The series of porous plates each have holes 186 extending therethrough. Preferably, the holes are not generally aligned with holes in adjacent plates in the series of porous plates.

FIG. 5 depicts a second embodiment of an acoustical dampening device 190 for use in the various embodiments of the gas injection systems 10 and 110 of the present invention. The device 190 includes a hollow housing 192 with an inlet 194 on one end and an outlet 196 on an opposite end. The device 190 is provided with a honeycomb structure 198 mounted within the housing 192 that serves the purpose of attenuating the flow disturbances as the disturbances pass through the honeycomb structure 198. The honeycomb structure 198 includes a plurality of passages 199 that extend longitudinally along the housing 192. The passages 199 preferably have hexagonal-shaped cross-sections, however, other cross-sectional shapes can be utilized, such as circles, ovals, triangles, squares, or any other enclosed geometrical shape.

Other embodiments of the acoustical dampening device can be utilized with the various embodiments of the gas injection systems 10 and 110 of the present invention, as will be readily apparent to one of ordinary skill in the art.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. A gas injection system for a processing reactor, the processing reactor including a mass flow controller and a vacuum chamber with an inject plate configured to be located above a substrate, said gas injection system comprising:
   a valve system having an inlet adapted to be connected to the mass flow controller, a first outlet, and a second outlet;
   a principle gas feed line connected to said first outlet of said valve system, said principle gas feed line being adapted to be connected to the inject plate;
   a start-up line connected to said second outlet of said valve system, said start-up line having an orifice adapted to be connected to the vacuum chamber at a position not above the substrate; and
   a controller configured to control said valve system to redirect gas flow to said start-up line and restrict gas flow to the principle gas feed line during a predetermined start-up period of the processing reactor, and to control said valve system to redirect gas flow to the principle gas feed line after said predetermined start-up period has ended.

2. The gas injection system according to claim 1, further comprising a pressure measurement device provided within said principle gas feed line.

3. The gas injection system according to claim 1, further comprising a pressure measurement device provided within said start-up line.

4. The gas injection system according to claim 1, further comprising an acoustical dampening device provided within said principle gas feed line.

5. The gas injection system according to claim 1, further comprising an acoustical dampening device provided within said start-up line.

6. The gas injection system according to claim 1, wherein said orifice of said start-up line is adapted to be located proximate to an exhaust port of the vacuum chamber.

7. The gas injection system according to claim 1, wherein said orifice of said start-up line is adapted to be located within an exhaust port of the vacuum chamber.

8. The gas injection system according to claim 1, wherein said valve system comprises a two-way valve.

9. The gas injection system according to claim 1, wherein said valve system comprises one or more valves.

10. A processing reactor comprising:
    a mass flow controller;
    a vacuum chamber with an inject plate configured to be located above a substrate;
    a valve system having a first outlet, a second outlet, and an inlet adapted to be connected to said mass flow controller;

a principle gas feed line connected to said first outlet of said valve system, said principle gas feed line being connected to said inject plate;

a start-up line connected to said second outlet of said valve system, said start-up line having an orifice connected to said vacuum chamber at a position not above the substrate; and a controller configured to control said valve system to redirect gas flow to said start-up line and restrict gas flow to the principle gas feed line during a predetermined start-up period of the processing reactor, and to control said valve system to redirect gas flow to the principle gas feed line after said predetermined start-up period has ended.

11. The processing reactor according to claim 10, wherein said inject plate is a reactor upper electrode, and said inject plate has a plurality of injection orifices.

12. The processing reactor according to claim 10, wherein said orifice of said start-up line is located proximate to an exhaust port of said vacuum chamber.

13. The processing reactor according to claim 10, wherein said orifice of said start-up line is located within an exhaust port of said vacuum chamber.

14. The processing reactor according to claim 10, wherein said valve system comprises a two-way valve.

15. The processing reactor according to claim 10, wherein said valve system comprises one or more valves.

16. A gas injection system for a processing reactor, the processing reactor including a mass flow controller and a vacuum chamber with an inject plate configured to be located above a substrate, said gas injection system comprising:

a valve having an inlet adapted to be connected to the mass flow controller, and a first outlet;

a first gas feed line connected to said first outlet of said valve, said first gas feed line being adapted to be connected to the inject plate; and an acoustical dampening device provided within said first gas feed line.

17. The gas injection system according to claim 16, wherein said valve is a two-way valve having a second outlet, and further comprising a second gas feed line connected to said second outlet of said two-way valve, said second gas feed line having an orifice adapted to be connected to the inject plate.

18. The gas injection system according to claim 17, further comprising a pressure measurement device provided within said second gas feed line.

19. The gas injection system according to claim 16, wherein said acoustical dampening device is a muffler having a series of porous plates therein.

20. The gas injection system according to claim 19, wherein said series of porous plates contain holes that are not generally aligned in adjacent plates.

21. The gas injection system according to claim 16, wherein said acoustical dampening device is a muffler having a honeycomb structure therein.

22. The gas injection system according to claim 16, further comprising a first pressure measurement device within said first gas feed line upstream of said acoustical dampening device and a second pressure measurement device within said first gas feed line downstream of said acoustical dampening device.

23. A processing reactor comprising:

a mass flow controller;

a vacuum chamber with an inject plate configured to be located above a substrate;

a valve having an inlet adapted to be connected to the mass flow controller, and a first outlet;

a first gas feed line connected to said first outlet of said valve, said first gas feed line being adapted to be connected to the inject plate; and an acoustical dampening device provided within said first gas feed line.

24. The processing reactor according to claim 23, wherein said inject plate is a reactor upper electrode, and said inject plate has a plurality of injection orifices.

25. The processing reactor according to claim 23, wherein said valve is a two-way valve having a second outlet, and further comprising a second gas feed line connected to said second outlet of said two-way valve, said second gas feed line having an orifice adapted to be connected to the inject plate.

* * * * *